United States Patent [19]
Holcombe et al.

[11] Patent Number: 4,528,939
[45] Date of Patent: Jul. 16, 1985

[54] ELECTRICALLY CONDUCTIVE CONTAINMENT VESSEL FOR MOLTEN ALUMINUM

[75] Inventors: Cressie E. Holcombe, Knoxville; Donald G. Scott, Oak Ridge, both of Tenn.

[73] Assignee: The United States of America as represented by the United States Department of Energy, Washington, D.C.

[21] Appl. No.: 623,875

[22] Filed: Jun. 25, 1984

[51] Int. Cl.$^3$ .............................................. C23C 13/12
[52] U.S. Cl. .................................. 118/726; 432/264; 432/265; 219/271; 219/275; 373/11
[58] Field of Search ............... 118/726, 727; 432/264, 432/265; 427/42; 501/96, 98; 219/271, 275; 373/10, 11; 252/520

[56] References Cited

U.S. PATENT DOCUMENTS

| | | | |
|---|---|---|---|
| 2,693,521 | 11/1954 | Alexander | 118/726 X |
| 2,895,849 | 7/1959 | Perlman et al. | 432/264 X |
| 3,180,632 | 4/1965 | Katz et al. | 432/264 |
| 3,181,968 | 5/1965 | Mandorf, Jr. | 427/42 |
| 3,216,710 | 11/1965 | Lenihan et al. | 219/271 X |
| 3,430,937 | 3/1969 | Spitzer | 432/264 X |
| 3,514,575 | 5/1970 | Hall et al. | 118/726 X |
| 3,515,852 | 6/1970 | Matheson et al. | 118/726 X |
| 3,598,958 | 8/1971 | Davey et al. | 219/275 |
| 3,649,734 | 3/1972 | Wilson | 432/264 X |

FOREIGN PATENT DOCUMENTS 485175  9/1975  U.S.S.R. .

Primary Examiner—John D. Smith
Assistant Examiner—Bernard F. Plantz
Attorney, Agent, or Firm—Earl L. Larcher; Stephen D. Hamel; Judson R. Hightower

[57] ABSTRACT

The present invention is directed to a containment vessel which is particularly useful in melting aluminum. The vessel of the present invention is a multilayered vessel characterized by being electrically conductive, essentially nonwettable by and nonreactive with molten aluminum. The vessel is formed by coating a tantalum substrate of a suitable configuration with a mixture of yttria and particulate metal borides. The yttria in the coating inhibits the wetting of the coating while the boride particulate material provides the electrical conductivity through the vessel. The vessel of the present invention is particularly suitable for use in melting aluminum by ion bombardment.

3 Claims, No Drawings

ELECTRICALLY CONDUCTIVE CONTAINMENT VESSEL FOR MOLTEN ALUMINUM

This invention was made as a result of work wnder Contract W-7405-ENG-26 between Union Carbide Corporation, Nuclear Division, and the U.S. Department of Energy.

Background of the Invention

The present invention is directed to a vessel for the containment of molten aluminum, and more particularly to an electrically conductive containment vessel for melting and evaporating aluminum metal in vapor plating processes.

The protection of various reactive metals such as uranium from corrosive environments is often achieved by plating the metal with corrosion inhibiting metals. Aluminum has been found to provide an adequate protective coating for reactive metals in many corrosive environments. The processes utilized for coating or plating metals with aluminum include vapor deposition processes wherein the aluminum metal is evaporated from a containment vessel in a vacuum chamber by bombarding the aluminum with an ion beam. The resulting aluminum vapor is then plated on selected surfaces of the metal at a controlled rate and thickness to form the protective aluminum coating. The containment vessel used for the molten aluminum in such plating operations must be electrically conductive for completing the current flow of the ion beam in order to effect the evaporation of the aluminum. Also, the vessel must be formed of a material which is nonreactive with molten or vaporous aluminum and which is essentially nonwetted by molten aluminum.

SUMMARY OF THE INVENTION

The primary aim or objective of the present invention is to provide a containment vessel for use in aluminum vapor plating operations with the vessel being characterized by being sufficiently electrically conductive to provide adequate current flow througn the vessel for maintaining the continuity of the electrical field for ion heating of the aluminum. Also, the vessel must be nonreactive with molten aluminum and essentially nonwettable by the molten aluminum. Generally, the containment vessel or crucible of the present invention is an electrically conductive multilayer crucible for melting aluminum. The vessel comprises a tantalum substrate in the configuration of a boat or crucible. A ceramic coating is deposited on the surface portions of the substrate contacted with molten aluminum. This coating consists essentially of a mixture of yttria and a sufficient concentration of a metal boride in particulate form to render the coating adequately electrically conductive for effecting the melt. The incorporation of the boride particles in the coating provides for the electrical conductivity through the coating while the yttria inhibits wetting of the coating and the underlying substrate. The combined mixture of the yttria and the metal boride provides a coating which is essentially nonreactive with molten aluminum.

Other and further objects of the invention will be obvious upon an understanding of the illustrative embodiment about to be described or will be indicated in the appended claims, and various advantages not referred to herein will occur to one skilled in the art upon employment of the invention in practice.

DETAILED DESCRIPTION OF THE PRESENT INVENTION

The invention is directed to a multilayer containment vessel particularly suitable for melting and evaporating aluminum metal for vapor deposition processes, especially where the vaporous aluminum metal is used for plating reactive metals. The containment vessel is electrically conductive so that the aluminum charge contained therein may be heated and vaporized by inductive heating or ion bombardment with the coating or the crucible being of sufficient conductivity for completion of the current flow in the ion beam circuit.

The multilayer containment vessel comprises a crucible or boat-shaped container of tantalum metal which is of a sufficient thickness to withstand hydraulic forces exerted by the molten aluminum. Tantalum crucibles with a wall thickness above about 0.005 inch exhibit sufficient structural integrity to retain the molten uranium and provide a substrate for a ceramic coating applied thereon. This coating is formed of a mixture of ceramics deposited on the surface portions of the tantalum container which are contactable by the molten and vaporous uranium. The coating consists essentially of about 45 to 55 wt. % yttria and about 45 to 55 wt. % refractory diboride particulates selected from the group consisting of titanium diboride, hafnium diboride, and zirconium diboride. A concentration of yttria greater than about 55 wt. % detracts from the electrical conductivity of the coating so as to impair the current flow through the crucible required for the melting of the aluminum charge by ion bombardment. On the other hand, a yttria concentration of less than about 45 wt. % yttria is insufficient to inhibit excessive wetting of the coating by the molten aluminum charge. The refractory diboride particulates are in a size range of about 2 to 75 microns and are uniformly dispersed throughout the coating so as to provide the necessary electrical conductivity.

The coating may be applied to the crucible in any suitable manner such as by plasma spraying the mixture onto the surface or by painting the coating onto the surface with a suitable brush or other mechanism. The thickness of the coating which is satisfactory for achieving the objective of the present invention is in the range of about 0.003 to 0.030 inch.

In a demonstration of the subject invention a tantalum crucible with a wall thickness of about 0.25 inch was coated with a mixture containing 50 wt. % titanium diboride and 50 wt. % yttria. The mixture was plasma sprayed onto the surface of the tantalum crucible to form an adherent coating of essentially 0.02 inch in thickness. The container with a 25 gram charge of aluminum was placed into a vacuum chamber of a hot hollow cathode plating system. The aluminum charge was then bombarded with argon ions until the aluminum was above the temperature of vaporization at a pressure of $1 \times 10^{-2}$ torr. The containment vessel demonstrated sufficient electrical conductivity to complete the current flow of the ion beam circuit. Examination of the container showed that the inner surface of the container was only slightly wetted by the aluminum metal with this slight wetting being insufficient to impair the operation of the vessel. There was no apparent reaction between the coating and the molten aluminum metal. Overall, the crucible sufficiently withstood this melting demonstration as to be in condition for reuse in repeated aluminum melting operations.

In another demonstration of the containment vessel of the present invention, a tantalum crucible having a wall thickness of about 0.005 inch was painted by brushing a powder mixture of 55 wt. % yttria and 45 wt. % zirconium diboride suspended in an aqueous solution containing 3 wt. % sodium carboxymethylcellulose onto the inside surface of the crucible. The coating was approximately 0.003 inch in thickness after drying and then outgassing in a vacuum furnace at 500° C. The coating was tenaciously bonded to the tantalum substrate. In this container a charge of aluminum weighing approximately 3 grams was resistance heated in a vacuum furnace in a vacuum of $1 \times 10^{-5}$ torr. The container was soaked for one hour at a temperature of 1,000° C. at this vacuum. Electrical continuity of the refractory diboride particles in the coating as determined by an ohmeter was sufficient for completing the circuit necessary for electrically melting the aluminum by ion bombardment. The coated container was slightly wetted by the aluminum but the extent of wetting was insufficient to inhibit the reuse of the container in subsequent aluminum melting and evaporation operations.

In an effort to improve the re-usability of the coated tantalum crucibles and provide optimum performance, the use of plasma-sprayed and painted layers on a single crucible was developed. For example, a 0.25 inch thick tantalum crucible was plasma-spray-coated with a mixture containing 50 wt. % titanium diboride and 50 wt. % yttria, forming an adherent permanent coating about 0.02 inch in thickness. This plasma-spray-coated crucible was then painted by brushing a powder mixture of 50 wt. % yttria suspended in an aqueous solution containing 3 wt. % sodium carboxymethylcellulose onto the inside surface of the crucible, forming an approximate 0.003 inch coating after vacuum drying at 500° C.

The latter coating was teraciously bonded to the permanently bonded plasma-sprayed coating, thus providing an expendable layer. This painted coating facilitated removal and recharging of the crucible. The residual aluminum sticks to the painted surface, pulling the painted coating off after it solidifies, without damaging the plasma-sprayed coating. With repainting of the crucible and vacuum drying at 500° C. the crucible can be readily reused.

It will be seen that the present invention provides a containment vessel for electrically melting and vaporizing aluminum with the coated vessel being electrically conductive, thermodynamically stable and chemically compatible with the molten aluminum.

We claim:

1. An electrically conductive vessel for melting aluminum, comprising a tantalum substrate and a coating deposit on surface portions of the substrate contactable with molten aluminum, said coating consisting essentially of a mixture of yttria and a sufficient concentration of a metal boride in particulate form to render the coating adequately electrically conductive for effecting the melt by ion bombardment.

2. The electrically conductive vessel as claimed in claim 1, wherein the metal boride is selected from the group consisting of titanium diboride, hafnium diboride and zirconium diboride, and wherein the particulate diboride is in a size range of about 2 to 75 microns.

3. The electrically conductive vessel as claimed in claim 1 wherein the yttria is in a concentration of about 45 wt. % to 55 wt. %, and wherein the particulate metal boride is in a concentration in the range of about 45 wt. % to 55 wt. %.

* * * * *